United States Patent
Park et al.

(10) Patent No.: US 11,736,078 B2
(45) Date of Patent: Aug. 22, 2023

(54) HIGH GAIN-BANDWIDTH PRODUCT (GBW) AMPLIFIER WITH PASSIVE FEEDFORWARD COMPENSATION

(71) Applicant: QUALCOMM Incorporated, San Diego, CA (US)

(72) Inventors: Joung Won Park, Bellevue, WA (US); Wei Zhuo, San Diego, CA (US); Li-chung Chang, Hillsboro, OR (US)

(73) Assignee: QUALCOMM Incorporated, San Diego, CA (US)

( * ) Notice: Subject to any disclaimer, the term of this patent is extended or adjusted under 35 U.S.C. 154(b) by 354 days.

(21) Appl. No.: 17/176,543

(22) Filed: Feb. 16, 2021

(65) Prior Publication Data

US 2022/0263479 A1    Aug. 18, 2022

(51) Int. Cl.
*H03F 3/45* (2006.01)
*H03F 3/19* (2006.01)
*H03F 1/32* (2006.01)
*H03F 1/26* (2006.01)

(52) U.S. Cl.
CPC .......... *H03F 3/45098* (2013.01); *H03F 1/26* (2013.01); *H03F 1/3211* (2013.01); *H03F 3/19* (2013.01); *H03F 2200/451* (2013.01)

(58) Field of Classification Search
CPC .................................................. H03F 3/45098
See application file for complete search history.

(56) References Cited

U.S. PATENT DOCUMENTS

| 10,856,225 | B2 * | 12/2020 | Chakraborty | ....... H04L 27/2647 |
| 2005/0040889 | A1 * | 2/2005 | Tsuchi | ................ H03F 3/45475 330/255 |
| 2008/0061857 | A1 * | 3/2008 | Kapusta | .................. H03F 3/005 327/337 |
| 2008/0272844 | A1 * | 11/2008 | Rayanakorn | ............ H03F 1/483 330/253 |
| 2011/0163808 | A1 * | 7/2011 | Kumar | ................ H03F 3/45179 330/296 |
| 2013/0113569 | A1 * | 5/2013 | Shibata | ............... H03F 3/45183 330/84 |

OTHER PUBLICATIONS

Thandri B.K., et al., "A Robust Feedforward Compensation Scheme for Multistage Operational Transconductance Amplifiers With No Miller Capacitors", Feb. 2003, IEEE Journal of Solid-state Circuits, vol. 38, No. 2, pp. 237-243.

* cited by examiner

*Primary Examiner* — Patricia T Nguyen
(74) *Attorney, Agent, or Firm* — Patterson+ Sheridan, L.L.P.

(57) ABSTRACT

Certain aspects of the present disclosure provide methods and apparatus for amplifying an input signal. One example apparatus is a differential amplifier that includes a positive input node, a negative input node, a positive output node, a negative output node, a positive input transistor having a gate coupled to the positive input node and having a drain coupled to the negative output node, a negative input transistor having a gate coupled to the negative input node and having a drain coupled to the positive output node, a first common-gate amplifier having an output coupled to the negative output node, a second common-gate amplifier having an output coupled to the positive output node, a first capacitive element coupled between the negative input node and an input of the first common-gate amplifier, and a second capacitive element coupled between the positive input node and an input of the second common-gate amplifier.

20 Claims, 6 Drawing Sheets

600

602

RECEIVE A DIFFERENTIAL INPUT SIGNAL BETWEEN A POSITIVE INPUT NODE AND A NEGATIVE INPUT NODE OF A DIFFERENTIAL AMPLIFIER STAGE, THE DIFFERENTIAL AMPLIFIER STAGE FURTHER COMPRISING A POSITIVE OUTPUT NODE, A NEGATIVE OUTPUT NODE, A POSITIVE INPUT TRANSISTOR HAVING A GATE COUPLED TO THE POSITIVE INPUT NODE AND HAVING A DRAIN COUPLED TO THE NEGATIVE OUTPUT NODE, A NEGATIVE INPUT TRANSISTOR HAVING A GATE COUPLED TO THE NEGATIVE INPUT NODE AND HAVING A DRAIN COUPLED TO THE POSITIVE OUTPUT NODE, A FIRST COMMON-GATE AMPLIFIER HAVING AN OUTPUT COUPLED TO THE NEGATIVE OUTPUT NODE, A SECOND COMMON-GATE AMPLIFIER HAVING AN OUTPUT COUPLED TO THE POSITIVE OUTPUT NODE, A FIRST CAPACITIVE ELEMENT COUPLED BETWEEN THE NEGATIVE INPUT NODE AND AN INPUT OF THE FIRST COMMON-GATE AMPLIFIER, AND A SECOND CAPACITIVE ELEMENT COUPLED BETWEEN THE POSITIVE INPUT NODE AND AN INPUT OF THE SECOND COMMON-GATE AMPLIFIER

604

AMPLIFY THE DIFFERENTIAL INPUT SIGNAL USING THE DIFFERENTIAL AMPLIFIER STAGE TO GENERATE A DIFFERENTIAL OUTPUT SIGNAL BETWEEN THE POSITIVE OUTPUT NODE AND THE NEGATIVE OUTPUT NODE

FIG. 6

HIGH GAIN-BANDWIDTH PRODUCT (GBW) AMPLIFIER WITH PASSIVE FEEDFORWARD COMPENSATION

TECHNICAL FIELD

Certain aspects of the present disclosure generally relate to electronic circuits and, more particularly, to a differential amplifier circuit.

BACKGROUND

Wireless communication networks are widely deployed to provide various communication services such as telephony, video, data, messaging, broadcasts, and so on. The wireless communication networks may include wireless communication apparatus, such as radio frequency (RF) receivers, transmitters, and transceivers. The wireless communication apparatus typically include RF front-end circuitry that operates on an RF signal being received or transmitted. For example, the front-end circuitry may downconvert a received RF signal to baseband and/or upconvert a baseband signal for RF transmission.

The RF front-end circuitry in some applications, such as in mobile communication cellular handsets, may include amplifier circuits, such as low noise amplifiers, power amplifiers, etc., to amplify RF signals. One issue with amplifier circuits is that they may become unstable at higher bandwidths associated with some communication applications.

SUMMARY

Certain aspects of the present disclosure provide a differential amplifier. The differential amplifier generally includes: a positive input node; a negative input node; a positive output node; a negative output node; a positive input transistor having a gate coupled to the positive input node and having a drain coupled to the negative output node; a negative input transistor having a gate coupled to the negative input node and having a drain coupled to the positive output node; a first common-gate amplifier having an output coupled to the negative output node; a second common-gate amplifier having an output coupled to the positive output node; a first capacitive element coupled between the negative input node and an input of the first common-gate amplifier; and a second capacitive element coupled between the positive input node and an input of the second common-gate amplifier.

The differential amplifier includes an input stage and also an output stage in certain aspects. The positive and negative output nodes may be output nodes of the input stage, and the output stage may include inputs coupled to the positive output node and the negative output node of the differential amplifier in these aspects.

Certain aspects of the present disclosure provide a method of signal processing. The method generally includes receiving a differential input signal between a positive input node and a negative input node of a differential amplifier stage. The differential amplifier stage includes: a positive output node; a negative output node; a positive input transistor having a gate coupled to the positive input node and having a drain coupled to the negative output node; a negative input transistor having a gate coupled to the negative input node and having a drain coupled to the positive output node; a first common-gate amplifier having an output coupled to the negative output node; a second common-gate amplifier having an output coupled to the positive output node; a first capacitive element coupled between the negative input node and an input of the first common-gate amplifier; and a second capacitive element coupled between the positive input node and an input of the second common-gate amplifier. The method also includes amplifying the differential input signal using the differential amplifier stage to generate a differential output signal between the positive output node and the negative output node.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 6 is a flow diagram of example operations for signal processing, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
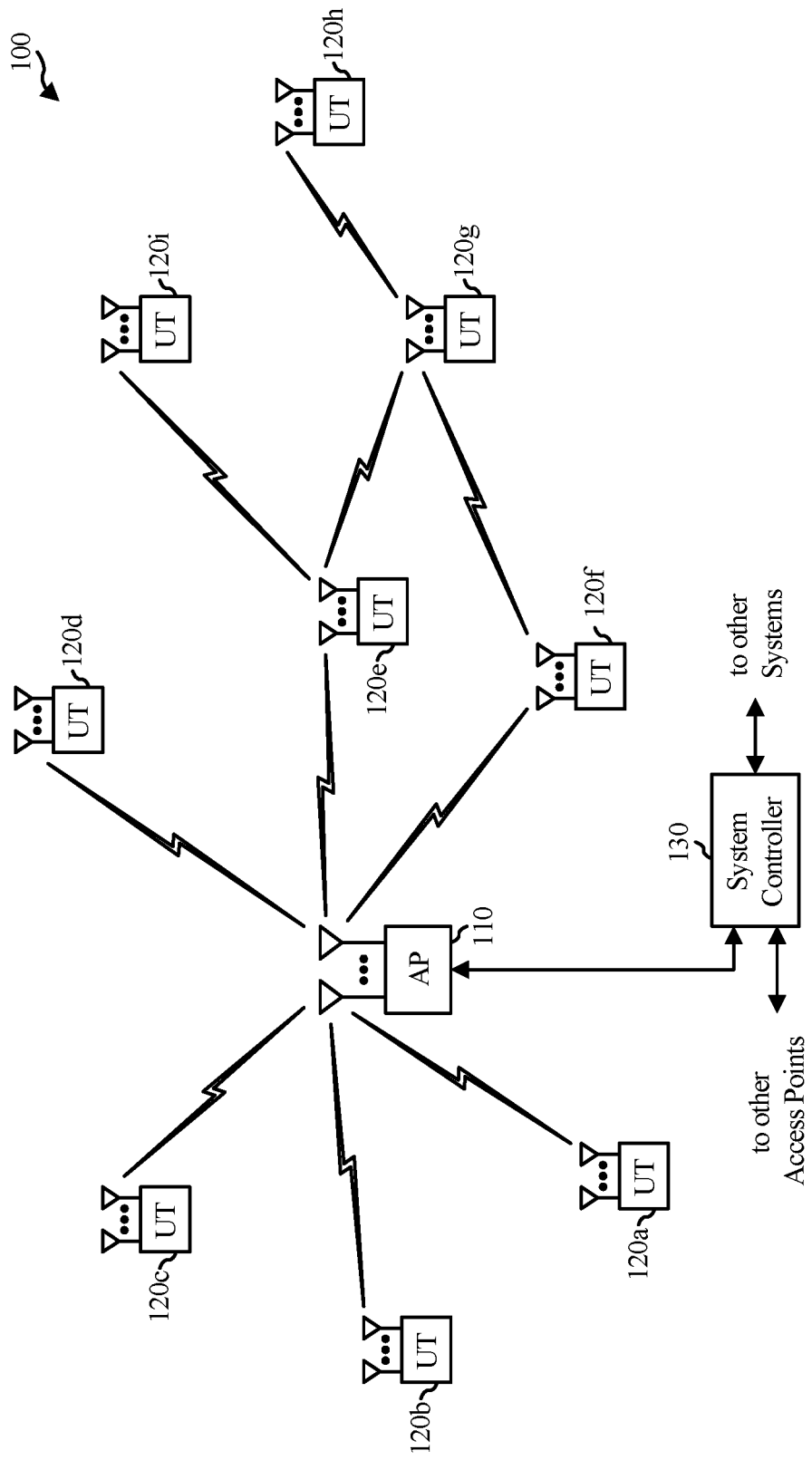
FIG. 1 is a diagram of an example wireless communications network, in accordance with certain aspects of the present disclosure.

Certain aspects of the present disclosure generally relate to methods and apparatus for processing signals using an amplifier, for example a differential amplifier. The differential amplifier may include multiple stages with feedforward compensation implemented with one or more passive components.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), New Radio (NR), also referred to as 5G (the fifth generation of mobile phone standards and technology), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include at least one differential amplifier circuit for processing signals as described below.

Figure 2:
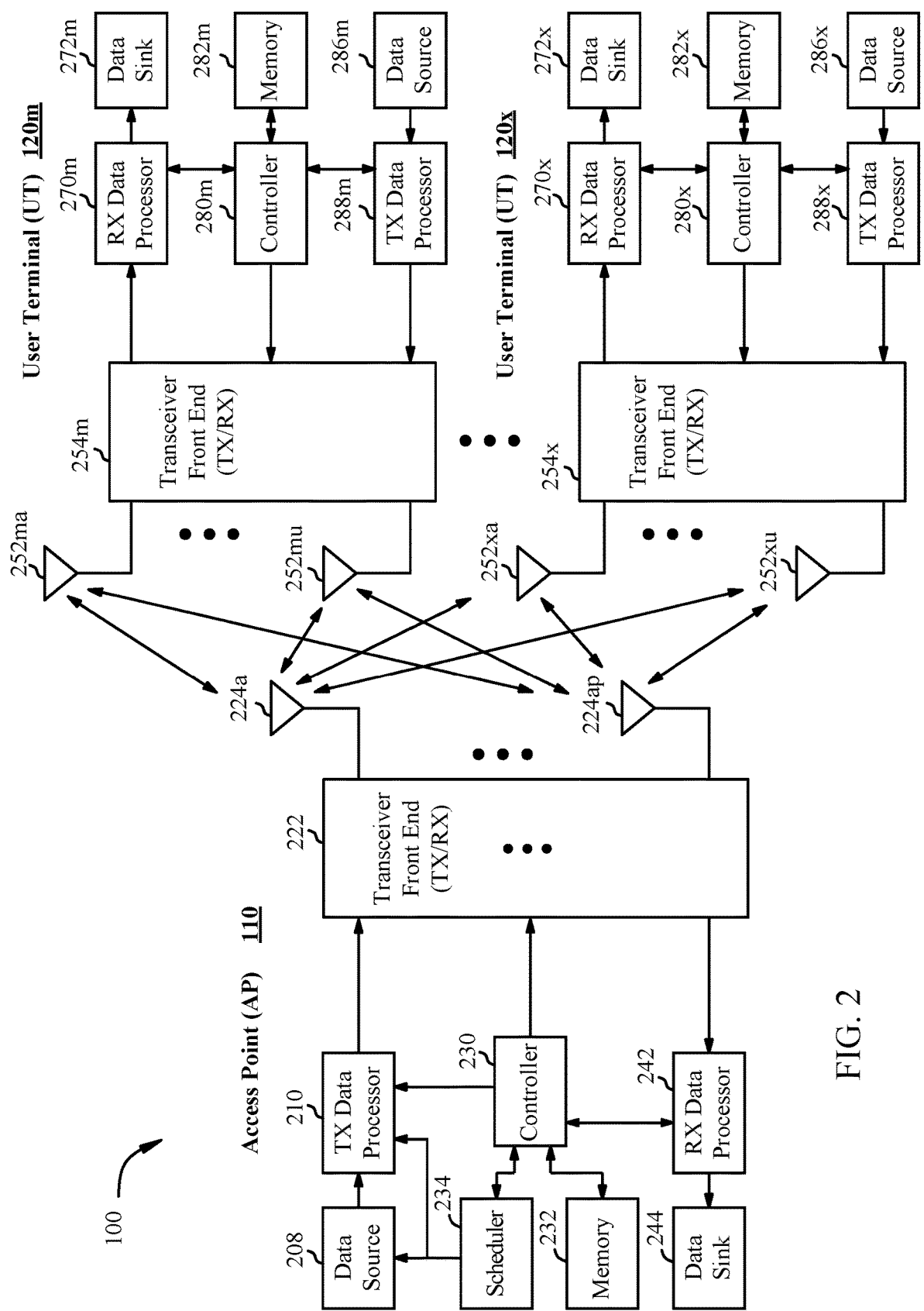
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{ap}$ may or may not be equal to $N_{dn}$, and $N_{ap}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. The signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front-end (TX/RX) 222 of access point 110 and/or transceiver front-end 254 of user terminal 120 may include one or more differential amplifier circuits for processing signals as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. The signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
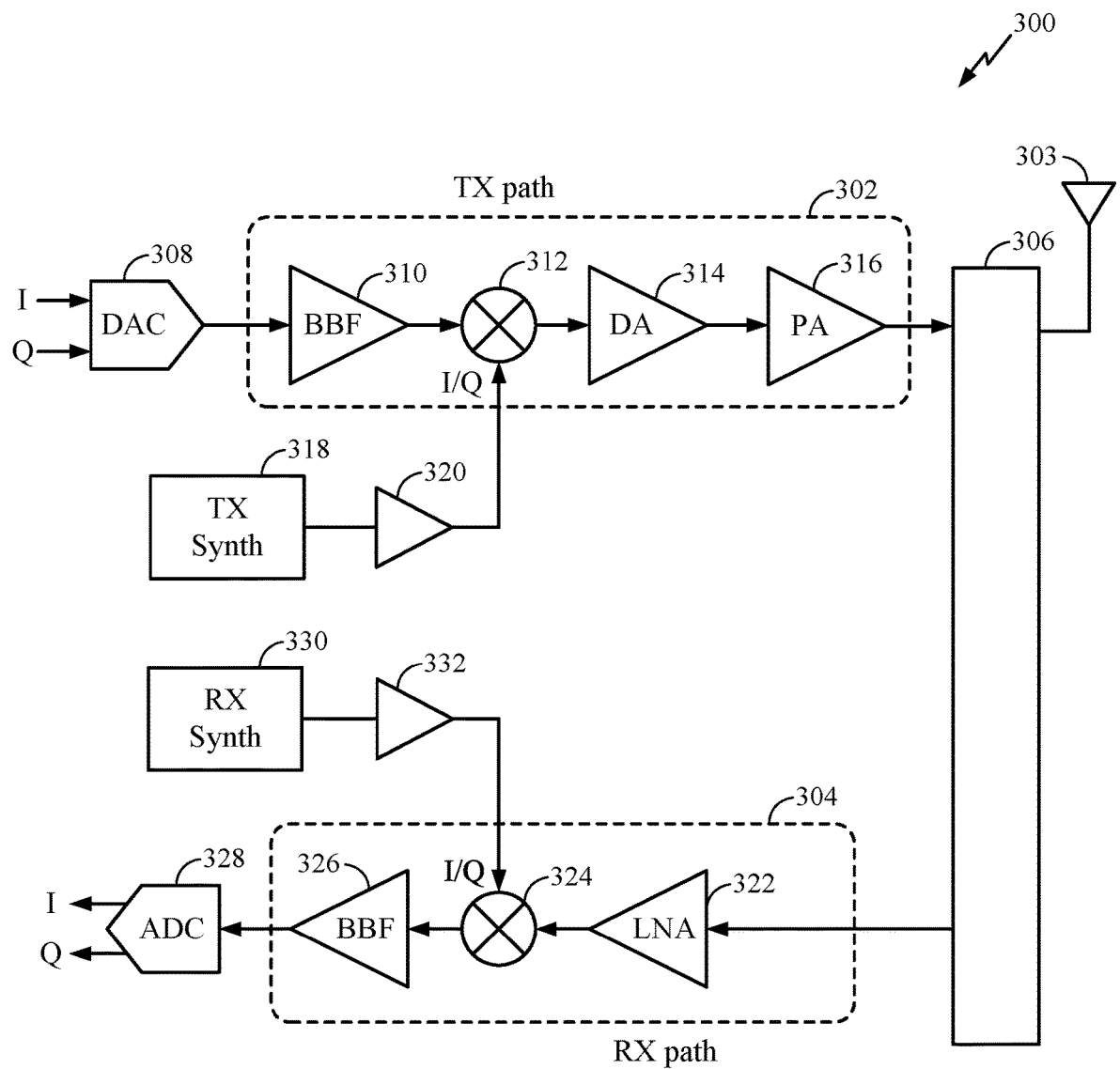
FIG. 3 is a block diagram of an example transceiver front-end, in accordance with certain aspects of the present disclosure.

FIG. 3 is a block diagram of an example transceiver front-end 300, such as transceiver front-ends 222, 254 in FIG. 2, in which aspects of the present disclosure may be practiced. The transceiver front-end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the LNA 322 may include one or more differential amplifier circuits for processing signals as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

An Example Amplifier with Passive Feedforward Compensation

Certain wireless communication networks (e.g., NR/5G) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), etc. These services may support communications with lower latency and higher throughput than earlier generations, such as 3G and 4G (the third and fourth generations of mobile phone standards and technology). However, compared to earlier generations, these 5G services may include stricter latency and bandwidth specifications. As a reference example, the receive bandwidth for certain applications can be as large as 200 MHz or greater (e.g., in the case of 5G mmW).

One challenge in amplifier circuit design may involve the desire to satisfy increasing bandwidth specifications while also maintaining stability. Certain amplifiers, for example, may require a large loop gain at the band edge in order to achieve sufficient linearity. Further, certain amplifiers that have a large loop gain may have to support a gain-bandwidth product (GBW) that is an order of magnitude greater than a required bandwidth (e.g., 2 GHz or greater GBW to support a receive bandwidth of 200 MHz or greater). An amplifier that has this increased GBW can be difficult to achieve due to stability issues. Accordingly, it may be desirable to provide an amplifier design that can support higher GBW, while maintaining stability (e.g., specified phase margin).

Figure 4:
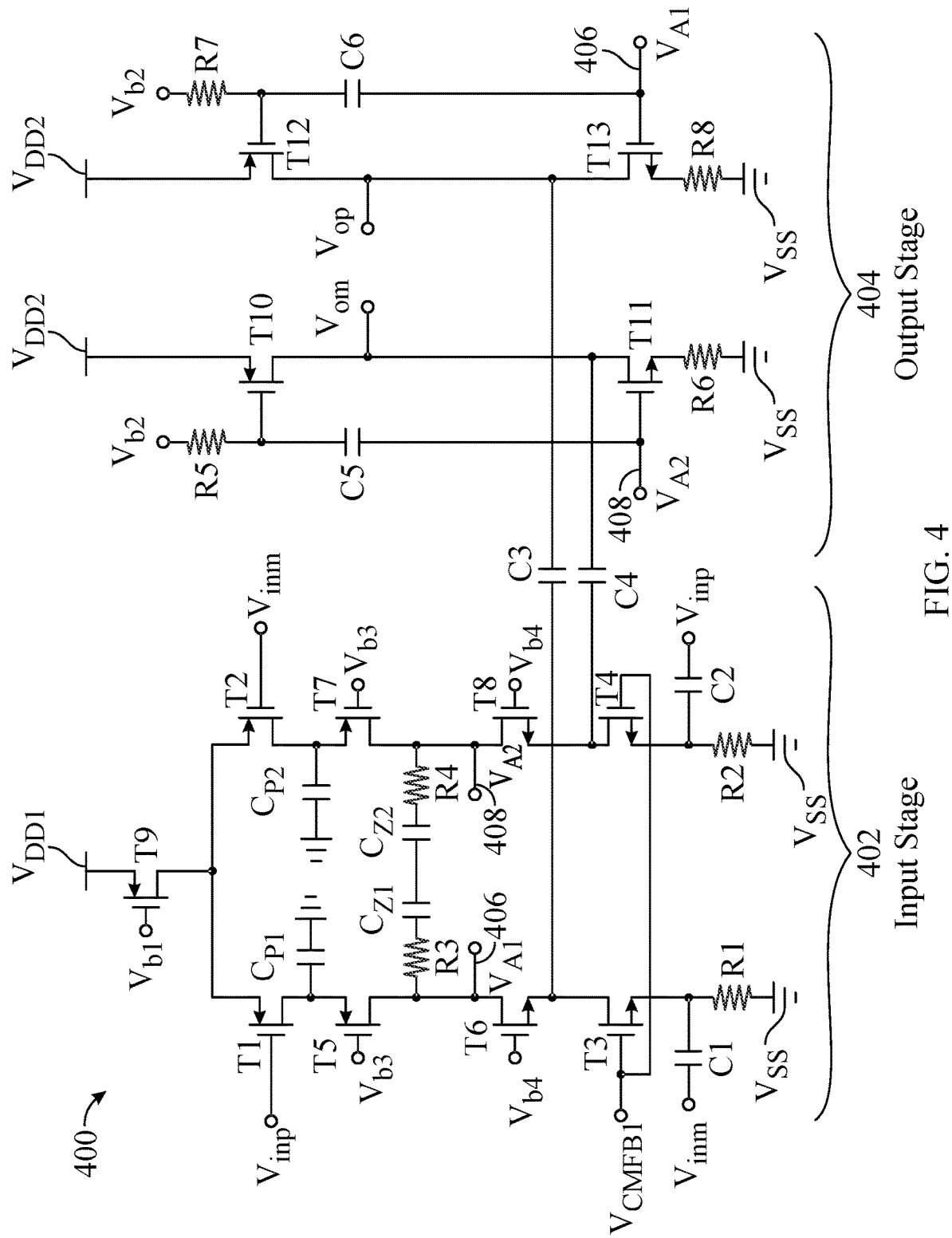
FIG. 4 is a schematic diagram of a differential amplifier, in accordance with certain aspects of the present disclosure.

Aspects presented herein describe a differential amplifier that can support higher gain-bandwidth product, while maintaining a specified phase margin for stability. FIG. 4 is a schematic diagram of an example amplifier 400, according to certain aspects of the present disclosure. Here, the amplifier 400 is implemented with two stages, e.g., an input stage 402 and an output stage 404. The amplifier 400 may be part of the RX path 304 (and more particularly, the LNA 322) described with respect to FIG. 3.

The input stage 402 includes a differential amplifier, which is configured to receive a differential input signal pair (e.g., $V_{input+}/V_{input-}$) via a positive input node (labeled "$V_{inp}$") and a negative input node (labeled "$V_{inm}$") and output a differential output signal pair (e.g., $V_{A1}/V_{A2}$) via a first stage negative output node 406 (e.g., $V_{A1}$) and a first stage positive output node 408 (e.g., $V_{A2}$). The output stage 404 is configured to receive the differential output signal pair from the input stage 402 via the first stage negative output node 406 and the first stage positive output node 408 and output a differential output signal pair (e.g., $V_{output+}/V_{output-}$) via the second stage positive output node (labeled "$V_{op}$") and the second stage negative output node (labeled "$V_{om}$") for the amplifier 400. As shown, the input stage 402 and the output stage 404 may have respective higher supply voltages (e.g., power supply voltage rails), $V_{DD1}$ and $V_{DD2}$. In some aspects, $V_{DD1}$ may be equal to $V_{DD2}$. In some aspects, $V_{DD1}$ may be different from $V_{DD2}$. The input stage 402 and the output stage 404 may share the same lower power supply voltage rail (labeled "$V_{SS}$"), which may be a reference potential node for the amplifier 400.

The differential amplifier of the input stage 402 includes transistors T1-T9. Transistor T1 is a positive input transistor, which has (i) a gate coupled to the positive input node $V_{inp}$, (ii) a source coupled to a drain of transistor T9, and (iii) a drain coupled to the first stage negative output node 406 (e.g., via transistor T5). For example, transistor T5 has a source coupled to the drain of transistor T1 and has a drain coupled to the first stage negative output node 406. The gate of transistor T5 can be coupled to biasing node $V_{b3}$. Transistor T6 has a drain coupled to the first stage negative output node 406 and has a source coupled to the second stage positive output node $V_{op}$ of the output stage 404 via capacitor C3. The gate of transistor T6 can be coupled to biasing node $V_{b4}$.

Transistor T2 is a negative input transistor, which has (i) a gate coupled to the negative input node $V_{inm}$, (ii) a source coupled to the drain of transistor T9, and (iii) a drain coupled to the first stage positive output node 408 (e.g., via transistor T7). For example, transistor T7 has a source coupled to the drain of transistor T2 and has a drain coupled to the first stage positive output node 408. The gate of transistor T7 can be coupled to the biasing node $V_{b3}$. Transistor T8 has a drain coupled to the first stage positive output node 408 and has a source coupled to the second stage negative output node $V_{om}$ via capacitor C4. The gate of transistor T8 can be coupled to the biasing node $V_{b4}$. The drain of transistor T5 is coupled to the drain of transistor T7 via a passive network (e.g., a resistor-capacitor network), which may include series-connected resistors R3 and R4 and capacitors $C_{Z1}$ and $C_{Z2}$, as illustrated in FIG. 4. The transistors T5 and T7 may be configured to operate in cascode with the transistors T1 and T2 in the embodiment illustrated in FIG. 4. In other embodiments, T5 and T7 may be omitted. For example, these transistors may be replaced by a resistor between the drain of T1 and the first stage negative output node 406 and by a resistor between the drain of T2 and the first stage positive output node 408, or the drain of transistor T1 may be directly connected to the first stage negative output node 406 and the drain of transistor T2 may be directly connected to the first stage positive output node 408.

Transistor T3 is configured as a common-gate amplifier having a source coupled to $V_{SS}$ (e.g., a voltage rail, such as electrical ground for the circuit) via resistor R1 and having a drain coupled to the source of transistor T6 and to the second stage positive output node $V_{op}$ via capacitor C3. Transistor T4 is configured as a common-gate amplifier having a source coupled to $V_{SS}$ via resistor R2 and having a drain coupled to the source of transistor T8 and to the second stage negative output node $V_{om}$ via capacitor C4. The gates of transistors T3 and T4 are coupled together and to a bias. In the embodiment illustrated in FIG. 4 the bias comprises a common mode feedback voltage and the gates of transistors T3 and T4 are coupled to a common-mode feedback node $V_{CMFB1}$. For example, the common-mode feedback node $V_{CMFB1}$ may be AC coupled to or otherwise derived from the differential output signal pair $V_{output+}$, $V_{output-}$ at the second stage positive output node $V_{op}$ and the second stage negative output node $V_{om}$. In some such embodiments, coupling the common mode feedback voltage to common-gate amplifiers T3 and T4 obviates a need to include additional transistors to couple AC signal feedback to the input stage 402. In other embodiments, one or more additional devices (e.g., transistors) may be included in the input stage 402 (e.g., coupled between the input nodes and the first stage output nodes) and coupled to an AC signal feedback. In such embodiments, the gates of common-gate amplifiers T3 and T4 may be coupled to a bias other than a common-mode feedback voltage. Further, in some embodiments, T6 and T8 may be omitted. For example, the drain of transistor T3 may be directly connected to the first stage negative output node 406 and the drain of transistor T4 may be directly connected to the first stage positive output node 408.

Transistor T9 is a quiescent current source coupled between $V_{DD1}$ and sources of transistors T1 and T2. The gate of transistor T9 can be coupled to biasing node $V_{b1}$.

The output stage 404 includes transistors T10-T13. Transistor T10 has (i) a source coupled to voltage rail $V_{DD2}$, (ii) a drain coupled to the second stage negative output node $V_{om}$, and (iii) a gate coupled to biasing node $V_{b2}$ via resistor R5 and coupled to the first stage positive output node 408 of the input stage via capacitor C5. Transistor T11 has (i) a source coupled to voltage rail $V_{SS}$ via resistor R6, (ii) a drain coupled to the second stage negative output node $V_{om}$, and (iii) a gate coupled to the first stage positive output node 408 of the input stage 402. A node or conductor connected to the gate of the transistor T11 may comprise a first input of the output stage 404. Transistor T12 has (i) a source coupled to voltage rail $V_{DD2}$, (ii) a drain coupled to the second stage positive output node $V_{op}$, and (iii) a gate coupled to biasing node $V_{b2}$ via resistor R7 and coupled to the first stage negative output node 406 of the input stage via capacitor C6. Transistor T13 has (i) a source coupled to voltage rail $V_{SS}$ via resistor R8, (ii) a drain coupled to the second stage positive output node $V_{op}$, and (iii) a gate coupled to the first stage negative output node 406 of the input stage 402. A node or conductor connected to the gate of the transistor T12 may comprise a second input of the output stage 404 In some embodiments, a common bias circuit generates separate bias voltages for each of Vb1-Vb4.

Transistors T1, T2, T5, T7, and T9 in input stage 402 and transistors T10 and T12 in output stage 404 may be p-type field-effect transistors (PFETs) as illustrated in FIG. 4. Transistors T3, T4, T6, and T8 in input stage 402 and transistors T11 and T13 in output stage 404 may be n-type field-effect transistors (NFETs), as shown.

In some aspects, a two-stage amplifier can include a parasitic pole at each input device that degrades the phase margin of the circuit. As illustrated in FIG. 4, for example, the amplifier 400 includes (i) parasitic capacitance $C_{P1}$ coupled to the drain of transistor T1 and the source of transistor T5 and (ii) parasitic capacitance $C_{P2}$ coupled to the drain of transistor T2 and the source of transistor T7. The parasitic capacitances $C_{P1}$ and $C_{P2}$ can significantly degrade the phase margin of the circuit at higher frequencies, making it difficult for the circuit to support higher gain-bandwidth product while maintaining stability.

In some aspects described herein, one or more feedforward paths are included within an amplifier circuit (e.g., a two-stage amplifier) to compensate, or at least adjust, for the parasitic poles at the positive input transistor T1 and the negative input transistor T2. As illustrated in FIG. 4, the differential amplifier of the input stage 402 includes (i) a capacitor C1 coupled between the negative input node $V_{inm}$ and the source of transistor T3 (configured as a common-gate amplifier) and (ii) a capacitor C2 coupled between the positive input node $V_{inp}$ and the source of transistor T4 (configured as another common-gate amplifier). In one aspect, the capacitor C1 and transistor T3 provide a first feedforward path from the negative input node $V_{inm}$ to the second stage positive output node $V_{op}$. Similarly, in one aspect, the capacitor C2 and transistor T4 provide a second feedforward path from the positive input node $V_{inp}$ to the second stage negative output node $V_{om}$.

The first and second feedforward paths can be configured to add a zero at relatively higher frequencies for the differential amplifier. For example, an additional negative component of the differential input signal can be fed forward from the negative input node $V_{inm}$ to the second stage positive output node $V_{op}$ at higher frequencies via the first feedforward path, and an additional positive component of the differential input signal can be fed forward from the positive input node $V_{inp}$ to the second stage negative output node $V_{om}$ at higher frequencies via the second feedforward path. By injecting the differential input signal through coupling capacitors C1 and C2 at high frequencies, aspects can significantly improve the phase margin of the amplifier 400 at higher frequencies, relative to conventional (two-stage) amplifiers. In some embodiments, a relatively higher frequency comprises a frequency in the upper quarter, or top 5% or 10%, of frequencies for which the differential amplifier is used.

Figure 5:
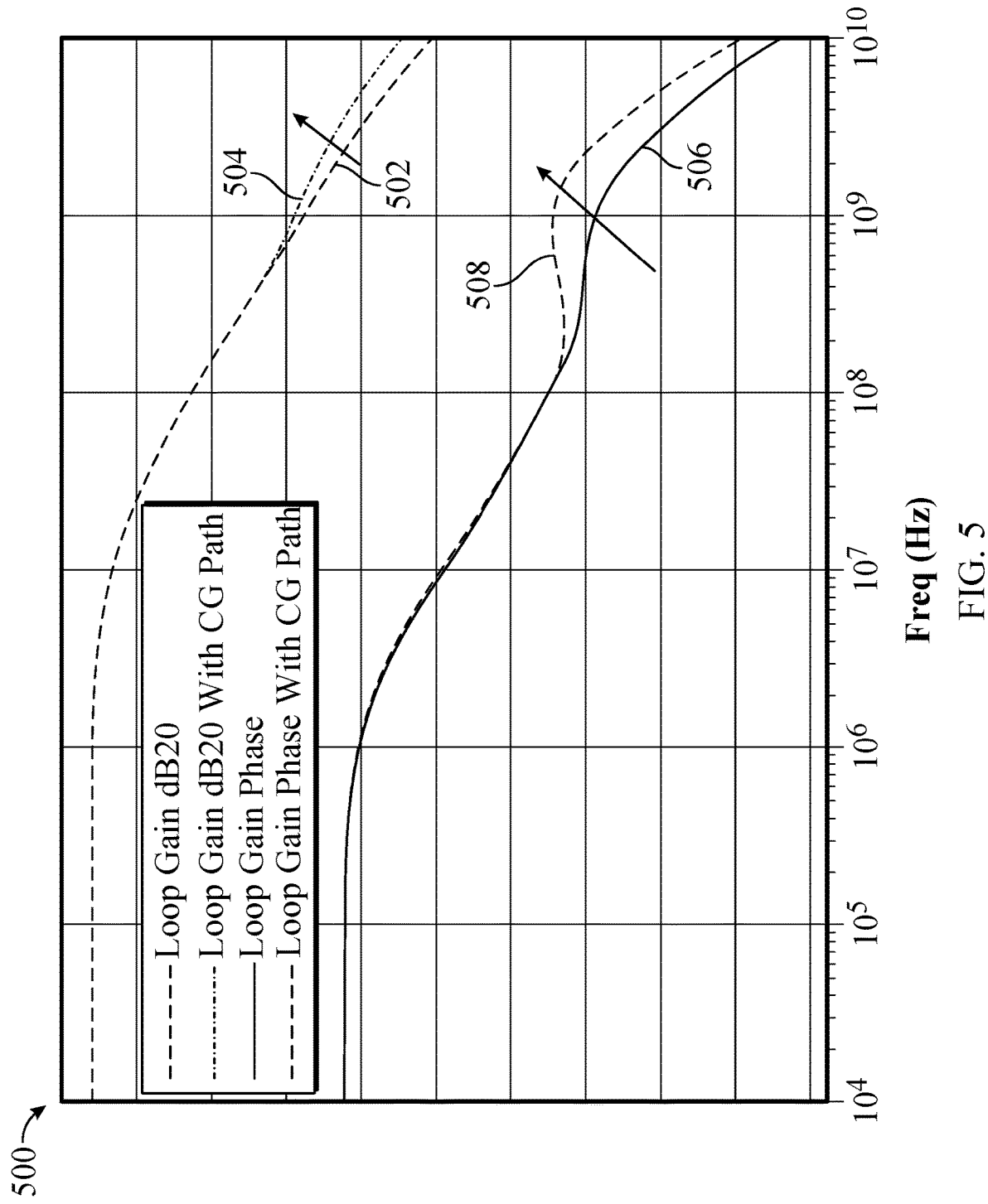
FIG. 5 is a graph showing gain and phase of a differential amplifier, in accordance with certain aspects of the present disclosure.

Those of skill in the art will understand that the differential amplifier illustrated in FIG. 4 may be configured or arranged in any number of different manners to implement various amplifier architectures. In some embodiments, the amplifier 400 may be implemented as an operational amplifier. In some such embodiments, the amplifier may comprise an operational transconductance amplifier (OTA). In some embodiments, the amplifier 400 may be modified to implement a transimpedance amplifier. For example, the amplifier 400 may be arranged to receive a current at the input nodes and may include resistors coupled between the second stage output nodes and (first stage) input nodes. In some such embodiments, a first resistor is coupled between the second stage positive output node $V_{op}$ and the negative input node $V_{inm}$, and a second resistor is coupled between the second stage negative output node $V_{om}$ and the positive input node $V_{inp}$. FIG. 5 is a graph 500 showing gain and phase of an amplifier (e.g., amplifier 400) with passive feedforward compensation relative to gain and phase of an amplifier without feedforward compensation, in accordance with certain aspects of the present disclosure. Here, curve 502 and curve 506 are representative of the loop gain and phase margin, respectively, of an amplifier without feedforward compensation, and curve 504 and curve 508 are representative of the loop gain and phase margin, respectively, of an amplifier (e.g., amplifier 400) with passive feedforward compensation. As shown, the loop gain of the amplifier with passive feedforward compensation is significantly improved at higher frequencies (e.g., $10^9$ Hz and greater), relative to the loop gain of the amplifier without feedforward compensation. Similarly, the phase margin of the amplifier with passive feedforward compensation is significantly improved at higher frequencies (e.g., $10^8$ Hz and greater), relative to the phase margin of the amplifier without feedforward compensation.

FIG. 6 is a flow diagram of example operations 600 for processing signals, in accordance with certain aspects of the present disclosure. The operations 600 may be performed by a circuit, such as the amplifier 400.

The operations 600 begin, at block 602, by receiving a differential input signal between a positive input node (e.g., $V_{inp}$) and a negative input node (e.g., $V_{inm}$) of a differential amplifier stage (e.g., input stage 402 of amplifier 400). The differential amplifier stage may also include: a negative output node (e.g., first stage negative output node 406); a positive output node (e.g., first stage positive output node 408); a positive input transistor (e.g., transistor T1) having a gate coupled to the positive input node and having a drain coupled to the negative output node; a negative input transistor (e.g., transistor T2) having a gate coupled to the negative input node and having a drain coupled to the positive output node; a first common-gate amplifier (e.g., transistor T3) having an output coupled to the negative output node; a second common-gate amplifier (e.g., transistor T4) having an output coupled to the positive output node;

a first capacitive element (e.g., capacitor C1) coupled between the negative input node and an input of the first common-gate amplifier (e.g., source of transistor T3); and a second capacitive element (e.g., capacitor C2) coupled between the positive input node and an input of the second common-gate amplifier (e.g., source of transistor T4).

The operations 600, at block 604, also include amplifying the differential input signal using the differential amplifier stage to generate a differential output signal between the positive output node and the negative output node. According to certain aspects, amplifying the differential input signal can include (i) feedforwarding a negative component of the differential input signal from the negative input node through a first feedforward path to a positive output node of a subsequent amplifier stage, where the first feedforward path includes the first capacitive element and the first common-gate amplifier, and (ii) feedforwarding a positive component of the differential input signal from the positive input node through a second feedforward path to a negative output node of the subsequent amplifier stage, where the second feedforward path includes the second capacitive element and the second common-gate amplifier. In these aspects, the feedforwarding of the negative and positive components of the differential input signal may include adding a differential current at relatively higher frequencies for the differential amplifier via the first and second feedforward paths.

The various operations of methods described above may be performed by any suitable means capable of performing the corresponding functions. The means may include various hardware component(s) and/or module(s). Generally, where there are operations illustrated in figures, those operations may have corresponding counterpart means-plus-function components.

For example, means for transmitting may comprise a transmitter (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front-end 300 depicted in FIG. 3). Means for receiving may comprise a receiver (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front-end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A differential amplifier comprising:
   a positive input node;
   a negative input node;
   a positive output node;
   a negative output node;
   a positive input transistor having a gate coupled to the positive input node and having a drain coupled to the negative output node;
   a negative input transistor having a gate coupled to the negative input node and having a drain coupled to the positive output node;
   a first common-gate amplifier having an output coupled to the negative output node;
   a second common-gate amplifier having an output coupled to the positive output node;
   a first capacitive element coupled between the negative input node and an input of the first common-gate amplifier; and
   a second capacitive element coupled between the positive input node and an input of the second common-gate amplifier.

2. The differential amplifier of claim 1, wherein the differential amplifier comprises an input stage and an output stage, wherein the positive and negative output nodes comprise output nodes for the input stage, wherein the first capacitive element and the first common-gate amplifier provide a first feedforward path from the negative input node to a positive output node of the output stage.

3. The differential amplifier of claim 2, wherein the second capacitive element and the second common-gate amplifier provide a second feedforward path from the positive input node to a negative output node of the output stage.

4. The differential amplifier of claim 3, wherein the first and second feedforward paths are configured to add a zero at relatively higher frequencies for the differential amplifier.

5. The differential amplifier of claim 1, wherein:
   the first common-gate amplifier has a source coupled to the first capacitive element and has a drain coupled to the negative output node; and
   the second common-gate amplifier has a source coupled to the second capacitive element and has a drain coupled to the positive output node.

6. The differential amplifier of claim 5, wherein a gate of the first common-gate amplifier and a gate of the second common-gate amplifier are coupled together and to a bias.

7. The differential amplifier of claim 6, wherein the bias comprises a common-mode feedback voltage.

8. The differential amplifier of claim 1, further comprising:
a first transistor having a source coupled to the drain of the positive input transistor and having a drain coupled to the negative output node;
a second transistor having a drain coupled to the drain of the first transistor and having a source coupled to the output of the first common-gate amplifier;
a third transistor having a source coupled to the drain of the negative input transistor and having a drain coupled to the positive output node; and
a fourth transistor having a drain coupled to the drain of the third transistor and having a source coupled to the output of the second common-gate amplifier.

9. The differential amplifier of claim 1, further comprising a current source coupled between a power supply rail and sources of the positive and negative input transistors.

10. The differential amplifier of claim 1, wherein the differential amplifier comprises an input stage and an output stage, wherein the positive and negative output nodes comprise output nodes for the input stage, wherein inputs of the output stage are coupled to the positive output node of the input stage and the negative output node of the input stage.

11. The differential amplifier of claim 10, further comprising:
a third capacitive element coupled between the output of the first common-gate amplifier and a positive output node of the output stage; and
a fourth capacitive element coupled between the output of the second common-gate amplifier and a negative output node of the output stage.

12. The differential amplifier of claim 11, further comprising two additional transistors, wherein the inputs of the output stage are respectively coupled to gates of the additional transistors, and wherein drains of the additional transistors are coupled to the positive output node and negative output node of the output stage.

13. The differential amplifier of claim 1, wherein the drain of the positive input transistor is directly connected to the negative output node, and wherein the drain of the negative input transistor is directly connected to the positive output node.

14. The differential amplifier of claim 1, wherein the output of the first common-gate amplifier is directly connected to the negative output node, and wherein the output of the second common-gate amplifier is directly coupled to the positive output node.

15. A method of signal processing with a differential amplifier, the method comprising:
receiving a differential input signal between a positive input node and a negative input node of a differential amplifier stage, wherein the differential amplifier stage further comprises a positive output node, a negative output node, a positive input transistor having a gate coupled to the positive input node and having a drain coupled to the negative output node, a negative input transistor having a gate coupled to the negative input node and having a drain coupled to the positive output node, a first common-gate amplifier having an output coupled to the negative output node, a second common-gate amplifier having an output coupled to the positive output node, a first capacitive element coupled between the negative input node and an input of the first common-gate amplifier, and a second capacitive element coupled between the positive input node and an input of the second common-gate amplifier; and
amplifying the differential input signal using the differential amplifier stage to generate a differential output signal between the positive output node and the negative output node.

16. The method of claim 15, wherein the amplifying comprises:
feedforwarding a negative component of the differential input signal from the negative input node through a first feedforward path to a positive output node of a subsequent stage of the differential amplifier, the first feedforward path comprising the first capacitive element and the first common-gate amplifier; and
feedforwarding a positive component of the differential input signal from the positive input node through a second feedforward path to a negative output node of the subsequent stage of the differential amplifier, the second feedforward path comprising the second capacitive element and the second common-gate amplifier.

17. The method of claim 16, wherein the feedforwarding of the negative and positive components of the differential input signal comprises adding a differential current at relatively higher frequencies for the differential amplifier via the first and second feedforward paths.

18. The method of claim 15, further comprising coupling a common-mode feedback voltage to the first and second common-gate amplifiers.

19. A differential amplifier comprising:
a first amplification stage, comprising:
a positive input node; and
a negative input node;
a second amplification stage having inputs coupled to outputs of the first amplification stage, the second amplification stage comprising:
a positive output node; and
a negative output node;
means for feeding a negative component of a differential input signal from the negative input node forward to the positive output node; and
means for feeding a positive component of the differential input signal from the positive input node forward to the negative output node.

20. The differential amplifier of claim 19, wherein the means for feeding a negative component and the means for feeding a positive component are coupled to a common-mode feedback voltage of the differential amplifier.

* * * * *